United States Patent [19]

Mastrangelo

[11] 4,054,714

[45] Oct. 18, 1977

[54] ELECTRICALLY CONDUCTIVE ADHESIVE COMPOSITION

[75] Inventor: Sebastian Vito Rocco Mastrangelo, Hockessin, Del.

[73] Assignee: E. I. Du Pont de Nemours and Company, Wilmington, Del.

[21] Appl. No.: 693,560

[22] Filed: June 7, 1976

[51] Int. Cl.$^2$ .......................... B32B 5/16; H01B 1/02
[52] U.S. Cl. .................................. 428/328; 428/403; 252/514; 156/333; 427/214
[58] Field of Search ...................... 252/514; 260/42.14, 260/42.22; 428/403, 328; 427/214; 156/333

[56] References Cited

U.S. PATENT DOCUMENTS

| | | | |
|---|---|---|---|
| 2,541,851 | 2/1951 | Wright | 260/37 SB |
| 2,808,352 | 10/1957 | Coleman et al. | 260/42.22 X |
| 3,140,342 | 7/1964 | Ehrreich et al. | 252/514 X |
| 3,206,419 | 9/1965 | Pritchard et al. | 260/42.46 X |
| 3,832,274 | 8/1974 | Owston | 260/42.22 X |
| 3,890,407 | 6/1975 | Briggs et al. | 260/878 R |
| 3,932,311 | 1/1976 | Caldwell et al. | 252/514 |

*Primary Examiner*—Benjamin R. Padgett
*Assistant Examiner*—E. Suzanne Parr

[57] ABSTRACT

Electrically conductive adhesive composition consisting essentially of polymeric binder, for example, "bouncing putty," conductive particles having at least their surfaces constituted by a noble metal and a normally liquid polyhydric alcohol, for example, glycerol.

15 Claims, No Drawings

ELECTRICALLY CONDUCTIVE ADHESIVE COMPOSITION

BACKGROUND OF THE INVENTION

1. Field of the Invention

This invention relates to electrically conductive adhesive compositions which are especially useful for bonding together surfaces of electronic devices.

2. Description of the Prior Art

Nonconductive adhesive compositions are well known in the art. For example, U.S. Pat. No. 3,890,407 discloses adhesive compositions consisting essentially of a chlorosulfonated polyethylene, or a mixture of a chlorinated polyethylene and a sulfonyl chloride, in certain polymerizable monomers, such as acrylic monomers, which compositions provide high bond strengths on curing, that is, on polymerization of the monomer. Conductive adhesive compositions which are prepared by adding conductive particles to nonconductive adhesive compositions are also known. Such compositions may require large amounts of solvents to dissolve certain of the components. U.S. Pat. No. 3,140,342 discloses an adhesive composition, useful as a gasket material, comprising a matrix binder, such as a polyvinyl chloride plastisol or a curable silicone or urethane, and conductive particles, such as aluminum, nickel, lead, zinc, cadmium, copper or iron particles coated with a noble metal, such as silver or gold.

SUMMARY OF THE INVENTION

It is an object of this invention to provide an electrically conductive adhesive composition which is curable at room temperature under aerobic or anaerobic conditions to a nonrigid high strength bonding material of low electrical resistance. Another object is to provide such a composition which has good shelf life and can be applied to water-wet or oil-wet surfaces. Still another object is to provide such a composition which, when cured, maintains its strength over a wide temperature range and is unaffected by moisture or salts. A further object is to provide an adhesive composition which does not require curing to achieve the aforesaid bonding characteristics. The objects of this invention are achieved by means of a composition consisting essentially of a polymeric binder, conductive particles having at least their surfaces constituted by a noble metal and a normally liquid polyhydric alcohol.

DETAILED DESCRIPTION OF THE INVENTION

It is well known in the trade that electrically conductive adhesives provide bonds which are of a flexible, nonrigid or rigid type. By a flexible adhesive is meant one which provides a bond which exhibits elastomeric properties. A rigid adhesive is one which provides a bond which exhibits no elastomeric properties under ordinary use conditions. A nonrigid adhesive is one which provides a bond which is elastomeric or nonelastomeric depending on use conditions.

The invention herein resides in a nonrigid, electrically conductive adhesive composition consisting essentially of a polymeric binder, conductive particles having at least their surfaces constituted by a noble metal and a normally liquid polyhydric alcohol. The invention also resides in such a composition which is curable on treatment with a polymerization catalyst. A preferred such curable composition comprises, in admixture, a polymer/sulfur-containing component, at least one polymerizable vinyl monomer, a vinyl monomer polymerization catalyst (maintained separate from the monomer until curing is effected), a polyhydric alcohol and conductive particles. Such a composition is referred to herein as a polymer in monomer/polyhydric alcohol/conductive particle composition. Preferably, in such a composition, the polymer/sulfur-containing component is either a chlorosulfonated polyethylene or a mixture of a sulfonyl chloride and a chlorinated polyethylene. In such mixtures the sulfonyl chloride can be one having 1 to 24 carbon atoms and 1 or 2 chlorosulfonyl groups, such as $C_{1-12}$ alkyl sulfonyl chlorides, for example, methane- or butane sulfonyl chloride; a $C_{6-24}$ aromatic sulfonyl chloride, for example, benzene- or toluene sulfonyl chloride; or a sulfonyl chloride having a heteroatom, for example, diphenylether-4,4'-disulfonyl chloride. Chlorinated polyethylenes are well known in the art, such as U.S. Pat. Nos. 2,212,786 and 2,405,971. The preferred polymer/sulfur-containing components are described, and preparative details are provided, in the aforesaid U.S. Pat. No. 3,890,407 and in U.S. Pat. No. 2,982,759. In a preferred curable composition such as mentioned above it has been found that about a 30% decrease in silver particles is realized, to provide a given electrical conductivity, as compared to a curable composition which is identical except that it is free of the polyhydric alcohol.

A further feature of this invention resides in the discovery that in place of the curable polymer in monomer/catalyst portion of the composition can be used a "bouncing putty," such as disclosed in U.S. Pat. No. 2,541,851, which consists of a silicone polymer having a balance of hydrophobic and hydrophilic moieties which provide unusual thixotropic elastomeric properties.

As already indicated above in connection with a preferred curable composition of this invention, details regarding the polymer/sulfur-containing component may be found in U.S. Pat. No. 3,890,407. This patent also describes the vinyl monomer and the vinyl monomer polymerization catalyst. More specifically, the linear or branched polyethylene from which the chlorinated or chlorosulfonated polyethylene is prepared should have a melt index, as determined by test method ASTM-D-1238-70 of 4 to 500. This ASTM test method is substantially similar to the earlier tentative test method ASTM-D-1238-52T. The relationship of melt index and molecular weight may be found in the aforesaid U.S. Pat. No. 2,982,759. Whether chlorosulfonated polyethylene or a mixture of a sulfonyl chloride and chlorinated polyethylene is used, there should be present 3 to 160 millimoles of sulfonyl chloride moiety per 100 grams of polymer. Moreover, the chlorine content of the chlorosulfonated polyethylene or the mixture of a sulfonyl chloride and chlorinated polyethylene should be about 25 to 70 weight percent.

Suitable polymerizable vinyl monomers for the purpose of this invention include acrylic monomers and mixtures of monomers, such as methyl methacrylate, ethyl methacrylate, acrylonitrile, methacrylonitrile, methyl acrylate, ethyl acrylate, butyl methacrylate, cyclohexyl methacrylate, hexyl methacrylate, 2-ethylhexyl methacrylate, lauryl methacrylate, butyl acrylate, cyclohexyl acrylate, hexyl acrylate, 2-ethylhexyl acrylate, lauryl acrylate, methacrylic acid, acrylic acid, glycidyl methacrylate, itaconic acid, ethylene glycol- and higher glycol acrylates and methacrylates, acrylamide and methacrylamide; halogenated monomers such as vinylidene chloride, chlorostyrene, 2,3-dichloro-1,3-butadiene and 2-chloro-1,3-butadiene; and styrene and mono- and polyalkylstyrenes, such as methylstyrene, dimethylstyrene, ethylstyrene and tert-butylstyrene. The preferred monomers are acrylic monomers, especially the lower alkyl acrylates and methacrylates and ethylene glycol diacrylate and dimethacrylate.

The relative proportions of chlorosulfonated polyethylene (or chlorinated polyethylene) and polymerizable vinyl monomer can vary within a rather broad range. In the case of acrylic monomers, the practical range is about 25 to 2,000 parts by weight of the monomer per 100 parts of chlorosulfonated or chlorinated polyethylene. The preferred range is 50 to 500 parts by weight of the monomer per 100 parts of polymer.

The curable adhesive compositions of this invention, that is, those which contain a polymer in monomer, require a vinyl monomer polymerization catalyst to effect hardening of the composition to a nonrigid form. Such catalysts are well known in the art. The following materials are disclosed in U.S. Pat. No. 3,890,407 and are useful herein as a polymerization catalyst for the vinyl monomer:

a. an amine initiator plus a transition metal compound promoter,
 b. an accelerator,
 c. a free radical generator and an initiator plus a promoter, or
 d. a free radical generator and an accelerator.

An amine initiator is usually used together with a transition metal compound as a promoter. Their respective relative weight ratios should be about 4:1 to 1:1; the preferred ratio is about 2:1. It is also possible to use an initiator or promoter alone, but the combination is much more effective. The preferred initiator is N,N-dimethylaniline; the preferred promoter is cobalt naphthenate. Other amines useful herein include N,N-dimethyltoluidine, N,N-dimethylaniline, N,N-diisopropyl(p-toluidine) and the guanidines; other useful promoters include the nickel, manganese and iron naphthenates, copper octoate, iron hexoate and iron propionate.

Various aldehydes and amines are suitable for the preparation of accelerators useful in the present invention. The aldehydes are, preferably, aliphatic aldehydes having 1 to 12 carbon atoms. Any primary aliphatic or aromatic amine having up to about 18 carbon atoms is suitable. Useful accelerators are described in U.S. Pat. No. 3,591,438. Typical aldehydes include acetaldehyde, butyraldehyde, propionaldehyde, cyclopentanal, hexanal, cyclohexanal, hydrocinnamaldehydes, heptanal, decanal and dodecanal. Typical amines include ethylamine, butylamine, pentylamine, cyclopentylamine, hexylamine, cyclohexylamine, octylamine, decylamine, dodecylamine, hexadecylamine, octadecylamine, aniline, tolyl amines and xylyl amines. In both the aldehyde and the amine series, various-position isomers are possible.

Free radical generators are well known to those skilled in the art and are described, for example, in "Free Radicals in Solution," C. Walling, J. Wiley & Sons, New York, 1957, and in "The Chemistry of Organic Film Formers," D. H. Solomon, J. Wiley and Sons, New York, 1967, p. 135 ff. The preferred free radical generators are organic peroxides and hydroperoxides.

The most preferred catalyst herein is a condensation product of butyraldehyde and aniline. It is to be understood that the catalyst must be kept separate from the polymer in monomer until the latter is to be cured in order to achieve maximum adhesion with the composition of this invention containing such polymer in monomer. Absent the catalyst, the curable adhesive composition of this invention exhibits extended shelf life under ambient conditions, for example, 4 to 6 months.

As already mentioned above, the polymer in monomer/catalyst portion of the inventive composition can be replaced with a "bouncing putty," such as disclosed in U.S. Pat. No. 2,541,851. Such a material and the polymer in monomer (with or without the polymerization catalyst) are referred to herein as a polymeric binder. In the case of the "bouncing putty" polymeric binder, the material is a nonrigid, non-hardening adhesive putty, optionally plasticized and/or tackified to achieve, respectively, workability and adherability to the surfaces being bonded together. According to the aforesaid cited U.S. Pat. No. 2,541,851 "bouncing putty," prepared from a dimethyl silicone oil and a boron compound, is regarded as a two-phase system comprising a highly crosslinked silicone network, with hydrophobic methyl groups attached to the silicon atoms, and a viscous hydrophilic liquid reaction product of the boron compound and some of the methyl silicone. The hydrophilic reaction product is a continuous phase which is both between and within the interstices of the crosslinked silicone. The balance of elastic and plastic properties of "bouncing putty" is attributed to a balance between the hydrophilic and hydrophobic groups. The material acts as a non-Newtonian thixotropic liquid in that its rate of flow increases slightly with shearing stress, that is, it acts as a plastic solid, but it can become hard and brittle if a very high pressure is suddenly applied.

The particles which are employed in the composition of this invention are conductive by virtue of their having at least their surfaces constituted by a noble metal, for example, silver or gold. Preferably, their cores, that is, the portions beneath the surfaces, also are of a noble metal, preferably the same noble metal as the surfaces, to ensure high electrical conductivity for the composition of the invention during use. Silver is the preferred noble metal herein. If the particle core is not a noble metal, it preferably is at least another electrically conductive metal.

The amount of particles used in the electrically conductive adhesive composition of this invention depends, among other things, on the size and the electrical conductivity of the particles. For instance, with glycerol-coated silver particles, preferred herein, the ratio by weight of the glycerol-coated particles to the balance of the composition is typically about 1:1 to 5:1, preferably 1.0:1 to 3.0:1. The lower limit is that below which the composition tends to show uncharacteristically high electrical resistivities for the type of particle employed. The upper limit is a practical limit above which overall adhesive characteristics begin to deteriorate. Regarding the size of the particles employed, the average mean diameter of commonly available commercial grades of silver particles is 0.1 to 50 microns. Significantly smaller or larger particle sizes may require lesser or greater amounts, respectively, of the aforesaid typical amounts.

Lap shear strengths obtained according to test method ASTM D-1002-64 have been found to provide a useful means for determining the requisite degree of particle loading. Generally, higher lap shear strengths are obtainable at lower particle loadings. One skilled in the art desiring a bond of a certain strength (lap shear strength) and electrical conductivity will be able to determine the type and amount of conductive particles to employ without undue experimentation.

Another essential ingredient of the composition of this invention is a normally liquid polyhydric alcohol, that is, it must be a liquid under use conditions, normally ambient conditions. Alcohols in solid form are not useful herein. Broadly, the useful alcohols include alkane and alkene polyols, such as 1,2,3-propanetriol (glycerol), 1,2-ethanediol (ethylene glycol), 1,2-propanediol (propylene glycol), 1,3-propanediol (trimethylene glycol), 1,4-butanediol (tetramethylene glycol) and polypropylene glycol. Glycerol is the preferred polyhydric alcohol. Usually, such liquids contain no more than 3 carbon atoms. In the case of a polymer in monomer binder, the alcohol can be introduced before or after curing (polymerization). If added before polymerization, the alcohol is admixed with the other components. Preferably, the alcohol is added as a liquid coating on the conductive particles prior to their admixture with the binder. The alcohol is usually inert and does not interact with common additives that may be present in a particular binder, for example, a vinyl monomer polymerization catalyst, a reinforcing agent, plasticizer, tackifying agent or softening agent. The amount of liquid polyhydric alcohol employed is small, usually 1 to 10% by weight of the conductive particles. Normally, 1 to 3% is sufficient. Various methods of application to the particle surfaces can be employed. Preferably, the liquid polyhydric alcohol is dissolved in a volatile solvent and the particles are stirred vigorously in the solution. The volatile solvent is then evaporatively removed to provide particles whose surfaces are coated with the liquid polyhydric alcohol. Alternatively, the liquid polyhydric alcohol can be introduced, for example, by milling, into the adhesive composition. In the preferred embodiment of this invention, glycerol-coated silver particles are employed.

In the case of the curable binders employed in the composition of this invention, curing can be effected simultaneously with the bonding, that is, the joining together, of the surfaces. When the adhesive composition will be of relatively thick cross-section in the bonded state, the catalyst can be employed in an amount which is about 2% to 3% by weight of the polymer in monomer. The adhesive composition is then applied to the surfaces to be bonded together and the surfaces are held in place during set time which is usually 1 to 5 minutes. For curing thin sections, thin coatings of the catalyst and then the balance of the adhesive composition can be applied to the two surfaces which are to be bonded together, after which the surfaces are held together until the adhesive sets, usually 3 to 8 minutes. For best results, joining of the surfaces to be bonded together should proceed quickly after introduction of the catalyst. If curing (polymerization) proceeds too far before the surfaces are joined, the bond will exhibit a greater electrical resistance than a bond produced when the surfaces are promptly joined together.

The composition of this invention is useful as a terminal board connection and as a solderless electrical bond. It is also useful in the electronics industry wherein connections having integrity must be made without the use of mechanical force or heat, for example, in the production of integrated circuits and liquid crystal displays. Various electrical conductors, including copper, brass, silver, aluminum and iron, can be bonded together by the adhesive composition of this invention. The adhesive composition of this invention also would appear to be useful for forming intricate conductive patterns over large surface areas. Any subsequent physical damage to such a conductive pattern could then be detected by sensing the increased electrical resistance of the pattern as a whole and, in fact, the location of the portion of the pattern physically damaged could be pinpointed. For example, a conductive pattern could be applied by silk-screening a mixture of polymer in monomer, and glycerol-coated silver particles, thinned to the desired consistency with, for example, methyl methacrylate, to a polymethylmethacrylate or polystyrene plastic surface. Then, the mixture on the plastic surface could be coated with a thin film of polymerization catalyst to induce curing. The plastic surface coated with the nonrigid conductive pattern could then be molded around the undercarriage of a military helicopter. If the helicopter subsequently is engaged in a military encounter and is struck and penetrated by a missile, a portion of the conductive pattern would be broken and a signal reflecting the pattern's change of resistance could be generated not only to indicate that the helicopter has been struck but to indicate where it has been struck.

It has been discovered that the unusual characteristics of the electrically conductive adhesive composition of this invention may not always be realized if a substantial amount of solvent (other than the polyhydric alcohol) is present. Hence, conventional cements, glues, lacquers and paints, all of which usually contain substantial amounts of volatile solvents, are not readily adaptable to the instant invention. Preferably, therefore, the adhesive composition of this invention is substantially solvent free and is defined as consisting essentially of binder, particles and polyhydric alcohol.

In the following examples all parts and percentages are by weight unless otherwise noted. Resistance values were determined, between metal electrodes, at ambient temperatures, by means of a Triplett Ohmmeter (unless otherwise noted) on bonded articles having a given thickness of adhesive composition. Examples 1 to 11 and 23 exemplify the invention. Examples 12 to 22 are comparative examples, that is, they exemplify compositions outside the claimed invention and confirm the essentiality of the polyhydric alcohol in the claimed adhesive composition. Following is a description of some of the materials employed in the examples.

A glycerol solution was prepared by dissolving 1.2 g of glycerol in 100 ml of methanol. To this solution were added 60 g of a commercially available, finely divided silver powder (Conductive Silver 4569), assayed as containing at least 99.1% Ag and no more than 0.02% chlorides, and a slurry was formed. The slurry was stirred vigorously by hand and then allowed to stand in a laboratory hood overnight to evaporatively remove the methanol and produce silver particles coated with 2% glycerol, based on the uncoated particle weight.

A polymer in monomer binder solution was prepared as follows. To a mixture of acrylic monomers consisting of 678 g of methyl methacrylate (containing 50 to 90 ppm of hydroquinone inhibitor), 22 g of glacial methacrylic acid (containing 250 ppm of 4-methoxyphenol) and 11 g of ethylene glycol dimethacrylate were added 400 g of chlorosulfonated polyethylene (Hypalon ® 20 Synthetic Rubber) made from branched polyethylene having a melt index of 10 and containing 29 percent chlorine and 1.4 percent sulfur. The entire mixture was rolled in a container at room temperature until dissolution of the polymer was complete. The resultant percentages by weight of components in the solution were: 36.8% Hypalon ® 20 Synthetic Rubber, 51.65% methyl methacrylate, 10.5% glacial methacrylic acid and 1.05% ethylene glycol dimethacrylate.

EXAMPLES 1–11

Ten portions of the aforesaid polymer in monomer binder were loaded with 1.1 to 2.0 parts (in increments of 0.1) of the aforesaid glycerol-coated silver powder and an eleventh portion was loaded with 3.0 parts of the same silver powder per part of said solution. Each solution into which silver powder had been stirred was used to slightly overfill a separate 7/32-inch diameter hole in a 3/32-inch thick phenolic circuit board backed by a copper plate. Separate ¼-inch copper discs punched out of 1/32-inch thick copper sheet were then primed with a commercially available vinyl polymerization catalyst, a condensation product of butyraldehyde and aniline (808 ® Accelerator), and pressed over each hole, squeezing out a slight excess of solution. The curable adhesive solution in each hole set within 15 minutes at room temperature to form eleven copper-electroded articles nonrigidly bonded with the adhesive composition of this invention. The resistances (shown in Table 1) were then measured between each copper disc and the copper backing plate.

COMPARISON EXAMPLES 12–22

Ten portions of the aforesaid polymer in monomer binder solution were loaded with 1.1 to 2.0 parts (in increments of 0.1) of the uncoated, finely divided silver powder (that is, without the glycerol) and an eleventh portion was loaded with 3.0 parts of the uncoated silver powder per part of said solution. The procedure of Examples 1–12 was then followed. The resistences obtained are shown in Table 2.

From the data of Examples 1–22 it can be concluded that approximately 30% less silver is required to achieve a given electrical resistance with the composition of this invention, as compared to a similar composition without the polyhydric alcohol.

EXAMPLE 23

Thoroughly mixed were 1,326 g of the aforesaid glycerol-coated silver powder and 100 g of a commercially available, finely-ground tackifying agent (Nancy Wood Rosin). A solution was prepared by dissolving 100 g of a commercially available silicone oil plasticizer (Silicone L-40/2000 centistoke oil) in 500 ml of petroleum ether having a boiling point of 37.7°–49.2° C. The solution was poured over the glycerol-coated silver powder-tackifying agent mixture and the entire mixture was stirred continuously until most of the ether had evaporated. It was then allowed to stand overnight to evaporatively remove the remaining ether. The resultant mixture was then milled with 500 g of a commercially available pink-colored "bouncing putty" (Silicone Putty SS-91) on a conventional 6-inch by 12-inch rubber mill until the mixture appeared uniformly silver-gray in color (45 minutes). The electrical resistivity of the milled product was determined to be 0.002 ohm-cm using a Keithley 502 Milliohmmeter. The product was useful as a nonrigid, electrically conductive, adhesive which was mechanically workable, for example, with the fingers, and readily adhered to metal, glass, plastic, ceramic, rubber and fluorocarbon surfaces on contact with only slight pressure, for example, with finger pressure. The adhesive was suitable for use in completing an electrical circuit and was capable of continuously passing at least 10 amperes/cm$^2$ current density.

TABLE 1

| Parts Silver Per Part of Binder | Resistance (ohms) |
|---|---|
| 1.1 | 0.59 |
| 1.2 | 0.25 |
| 1.3 | 0.1 |
| 1.4 | 0.47 |
| 1.5 | 0.16 |
| 1.6 | 0.07* |
| 1.7 | <0.1 |
| 1.8 | 0.09* |
| 1.9 | 0.1 |
| 2.0 | 0.15 |
| 3.0 | 0.02* |

*As measured with a Keithley Model 502 Milliohmmeter.

TABLE 2

| Parts Silver Per Part of Binder | Resistance (ohms) |
|---|---|
| 1.1 | 8.3 |
| 1.2 | 24.5 |
| 1.3 | 3.9 |
| 1.4 | 0.88 |
| 1.5 | 0.55 |
| 1.6 | 0.59 |
| 1.7 | 0.1 |
| 1.8 | 0.3 |
| 1.9 | 0.1 |
| 2.0 | 1.8 |
| 3.0 | 0.03* |

*As measured with a Keithley Model 502 Milliohmmeter.

I claim:

1. Nonrigid electrically conductive adhesive composition consisting essentially of polymeric binder, conductive particles having at least their surfaces constituted by a noble metal and a normally liquid polyhydric alcohol.

2. Composition of claim 1 wherein the conductive particles are noble metal throughout.

3. Composition of claim 2 wherein the noble metal is silver.

4. Composition of claim 1 wherein the polyhydric alcohol is glycerol.

5. Composition of claim 4 wherein the polyhydric alcohol employed in the formation of the composition is a coating on the particles employed in the formation of the composition.

6. Composition of claim 1 wherein the polyhydric alcohol is present in an amount which is 1 to 10% by weight of the conductive particles.

7. Composition of claim 5 wherein the particles are silver particles and the weight ratio of the glycerol-coated particles to the balance of the composition is within the range 1:1 to 5:1.

8. Composition of claim 3 wherein the silver particles have a mean diameter of 0.1 to 50 microns.

9. Composition of claim 1 wherein the polymeric binder is a polymer in monomer.

10. Composition of claim 9 wherein the polymer is a chlorosulfonated polyethylene and the monomer is an acrylic monomer.

11. Composition of claim 10 wherein the acrylic monomer is a mixture of methyl methacrylate, methacrylic acid and ethylene glycol dimethacrylate.

12. Composition of claim 11 wherein the acrylic monomer mixture contains a condensation product of butyraldehyde and aniline as a polymerization catalyst.

13. Composition of claim 1 wherein the polymeric binder is a "bouncing putty" silicone polymer.

14. Composition of claim 13 wherein the silicone polymer contains a tackifying agent and a plasticizer.

15. Article having at least two surfaces bonded together with the composition of claim 1.

* * * * *